United States Patent [19]

Cochran et al.

[11] 4,132,951

[45] Jan. 2, 1979

[54] DIGITAL PROCESSOR CONTROLLED RADIO SYSTEM

[75] Inventors: Michael J. Cochran, Richardson; Edward R. Caudel, Dallas, both of Tex.

[73] Assignee: Texas Instruments Incorporated, Dallas, Tex.

[21] Appl. No.: 791,254

[22] Filed: Apr. 27, 1977

[51] Int. Cl.² .......................................... H04B 1/06
[52] U.S. Cl. ................................ 325/452; 333/70 T
[58] Field of Search ................. 325/25, 15, 20, 21, 325/452, 459; 328/167; 333/70 T

[56] References Cited

U.S. PATENT DOCUMENTS

| 3,535,636 | 10/1970 | Muilwijk | 325/25 |
|---|---|---|---|
| 3,588,701 | 6/1971 | Kahn | 325/15 |
| 3,641,434 | 2/1972 | Yates | 325/25 |
| 3,809,923 | 5/1974 | Esser | 328/167 |
| 3,835,384 | 9/1974 | Liff | 325/25 |
| 3,953,745 | 4/1976 | Bailey | 328/167 |
| 3,978,416 | 8/1976 | Sutphin | 328/167 |
| 3,983,484 | 9/1976 | Hodama | 325/20 |
| 4,027,242 | 5/1977 | Yamanaica | 325/25 |

Primary Examiner—Robert L. Richardson
Assistant Examiner—Michael A. Masinick
Attorney, Agent, or Firm—Stephen S. Sadacca; Rene Grossman

[57] ABSTRACT

A radio system includes a charge transfer device transversal filter for receiving electronic input signals comprised of at least one frequency band. The charge transfer device simultaneously receives a clocking signal, and filters and frequency shifts its input signals in response to the frequency of the clocking signal. Clocking means are provided for generating the clocking signal at frequencies as indicated in digital micro commands. A digital processor has outputs coupled to the clocking means for sending the micro commands to the clocking means.

4 Claims, 36 Drawing Figures

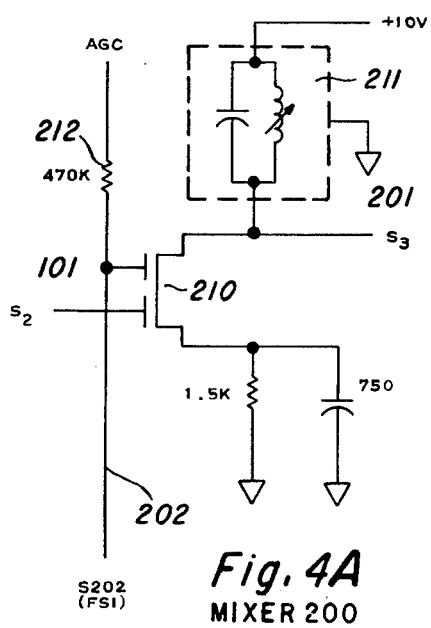
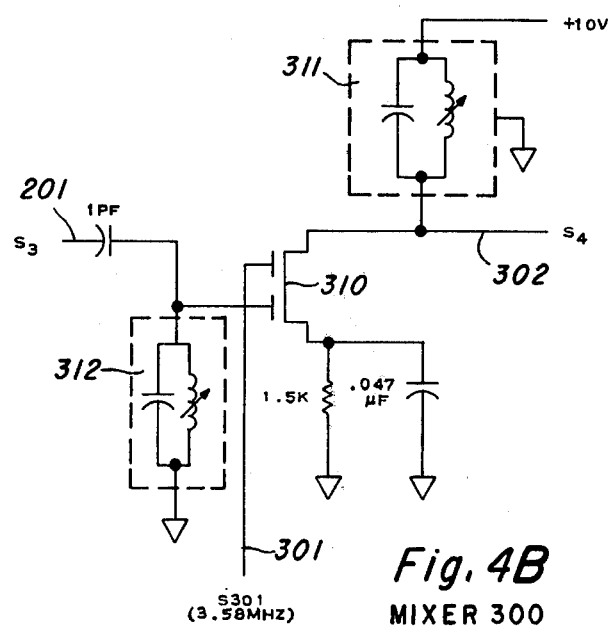
Fig. 4A MIXER 200
Fig. 4B MIXER 300

CCD-FILTER 700

AM/SSB DETECTOR 900

Fig. 6A
CLOCKING MODULE 3100

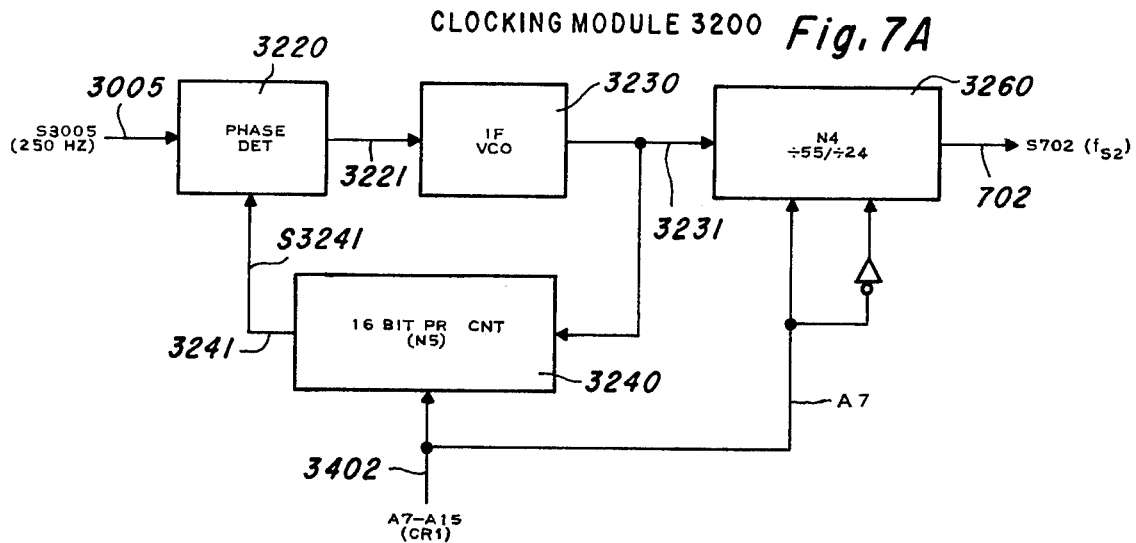
Fig. 7A
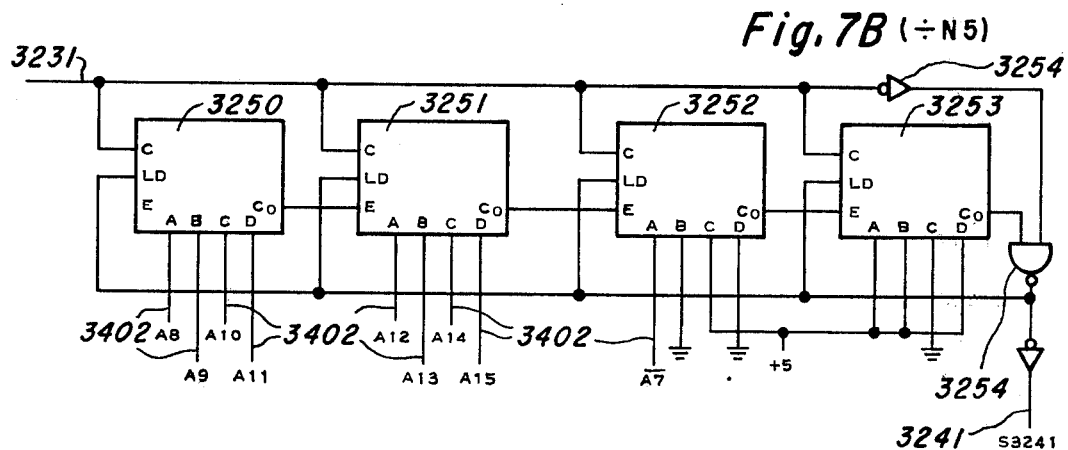
Fig. 7B (÷N5)
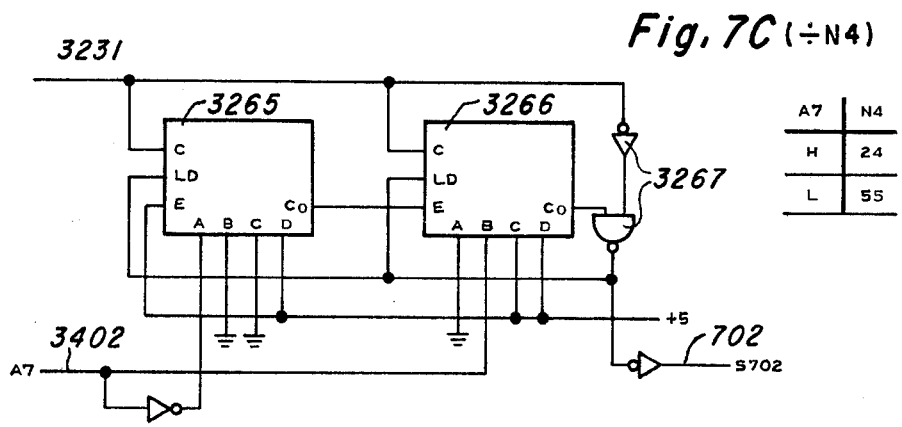
Fig. 7C (÷N4)

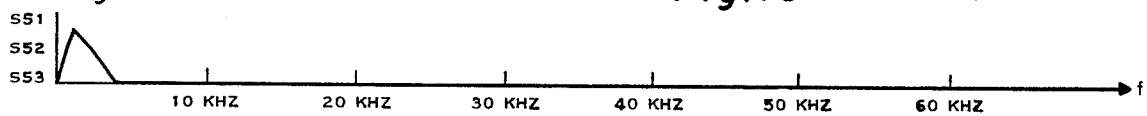
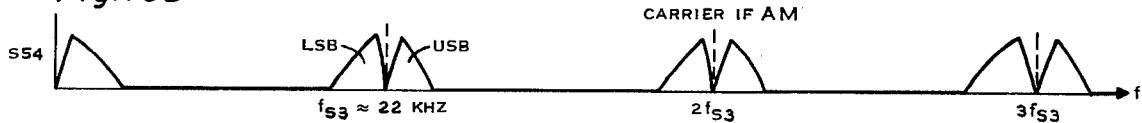
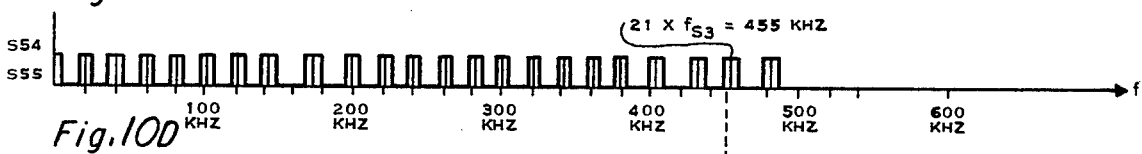
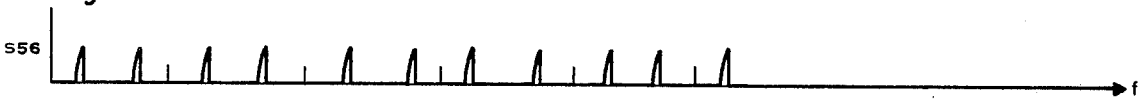
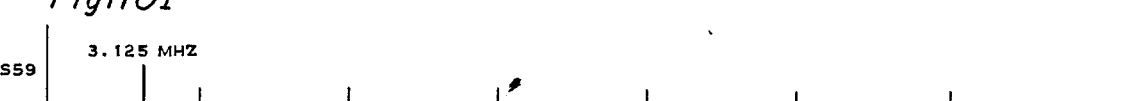
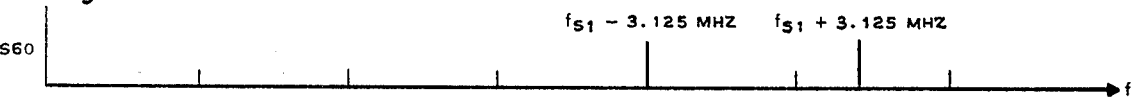

DIGITAL PROCESSOR CONTROLLED RADIO SYSTEM

BACKGROUND OF THE INVENTION

This invention relates to analog signal processing, and more particularly, to digital processor controlled radio systems.

This invention further relates to the transceiver and components thereof described and claimed in the following U.S. patent applications filed of even date with and assigned to the asignee of the present invention: U.S. Ser. No. 791,264 entitled "An Electronic Phase Locked Loop" by Michael J. Cochran; U.S. Ser. No. 791,611 entitled "A Digitally Transmitting Transceiver" by Edward R. Caudel and William R. Wilson; U.S. Ser. No. 791,629 entitled "A Clarifying Radio Receiver" by Michael J. Cochran and Edward R. Caudel; U.S. Ser. No. 791,449 entitled "An Automatically Clarifying Radio Receiver" by Michael J. Cochran and Edward R. Caudel; U.S. Ser. No. 791,450 entitled "A Transceiver With Only One Reference Frequency" by Michael J. Cochran; U.S. Ser. No. 791,265 entitled "A Signal Strength Measuring Transceiver" by Edward R. Caudel; U.S. Ser. No. 791,614 entitled "A Charge Transfer Device Radio System" by Michael J. Cochran: U.S. Ser. No. 791,253 entitled "A Transceiver Capable of Sensing A Clear Channel" by Jerry D. Merryman, Michael J. Cochran and Edward R. Caudel; U.S. Ser. No. 791,616 entitled "A Dual Processor Transceiver" by Edward R. Caudel, William R. Wilson and Thomas E. Merrow. Such copending patent applications are hereby incorporated herein by reference.

Radio systems receive radiated electronic input signals comprised of a plurality of non-overlapping frequency bands, filter one of the bands from the plurality, frequency shift the one band from radio frequencies to lower frequencies, and convert the selected band to audible sounds. The input signals may be amplitude modulated (AM), or single sideband (SSB) signals as an example. Antenna means receive the radiated input signals. Conventionally, filtering devices are included in the radio system to select one of the bands from the plurality, and mixing devices are included to frequency shift the selected band. Demodulator devices are also included to demodulate the selected band.

The radio system herein described includes a computer controlled charge transfer device to selectively filter both single sideband input signals and AM input signals. This filtering is performed by a charge transfer device filter having passbands whose bandwidth and location in the frequency domain are dependent upon the frequency of the filter's clocking signal. When the charge transfer device filter is clocked with one frequency, it passes AM signals; and when it is clocked with another frequency, the filter passes single sideband signals.

The system herein described further includes clocking means having outputs coupled to generate the filter's clocking signals. The clocking means has inputs coupled to receive digital microcommands which identify the selectable frequency of the filter clocking signal. The clocking means interprets the microcommands, and in response thereto, generates filter clocking signals of the identified frequency.

A digital processor is also included in the disclosed radio system. The digital processor has outputs coupled to the clocking means for sending the microcommands thereto. As a result of this architecture, the disclosed radio system is highly flexible. That is, it has the advantage of having no hard-wired control circuitry. And thus, the digital processor is capable of receiving a variety of manually activated input signals specifying various operating modes, of interpreting the input signals via a flexible program, and of sending the microcommand to the clocking means in a manner which implements the specified operating mode.

The disclosed radio system further includes mixing means for frequency shifting the input signals and output signals of the charge transfer device filter. The amount of this frequency shift is dependent upon the frequency of the mixers' clocking signals; and the mixer clocks are also generated by the clocking means in response to microcommands from the digital processor which may comprise a microprocessor. Thus, this architecture further increases the flexibility of the system since the digital processor has control of both the frequency shifting and frequency filtering within the system.

Another advantage of the present invention is that the control circuitry is centralized. As a result, the filter means, the clocking means, and the digital processor means are each clearly identifiable entities. Such modularization is desirable for ease in fabrication and maintenance. As an example, the filter means or clocking means is capable of being checked out separately before being integrated into the radio system.

Accordingly, it is one object of the invention to provide an improved radio system.

Another object of the invention is to provide a radio system having flexible centralized control circuitry.

Another object of the invention is to provide a radio system having filter passbands which are selectable by microcommands from a digital processor.

Another object of the invention is to provide a radio system having mixers which frequency shift signals in response to microcommands from a digital processor.

Still another object of the invention is to provide a radio system which is modular for ease in fabrication and maintenance.

SUMMARY OF THE INVENTION

These and other objects are accomplished in accordance with the radio system of the invention which includes a digital processor and a charge transfer device transversal filter. The filter receives clocking signals having a selectable frequency. In response to the selectable frequency, the charge transfer device filters and frequency shifts an AM or an SSB band from its input signals. Clocking means are included for generating the selectable frequency charge transfer device clocking signal. The clocking means has inputs coupled to receive digital microcommands identifying a selected frequency. In response to the microcommands, the clocking means generates the clocking signals of the indicated frequency. Digital processor means having outputs coupled to the clocking means inputs is included for sending microcommands thereto. The digital processor thus provides a flexible centralized control for the filter. The system further includes mixing means for frequency shifting signals in the radio. The mixers operate in response to clocking signals having frequencies that are also selectable by microcommand via the digital processor.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in conjunction with the accompanying drawings; wherein:

FIGS. 4A–4C are detailed circuit diagrams of mixer 200, mixer 300 and CCD filter 700, respectively.

FIGS. 6A and 6B are detailed circuit diagrams of a clocking module 3100 included within FIG. 2.

FIGS. 7A–7D are detailed logic diagrams of a clocking module 3200 included within FIG. 2.

FIGS. 10A–10K are a series of frequency diagrams illustrating signals at various points on the transmit signal path of FIG. 9.

DETAILED DESCRIPTION OF SPECIFIC EMBODIMENTS

Figure 1:
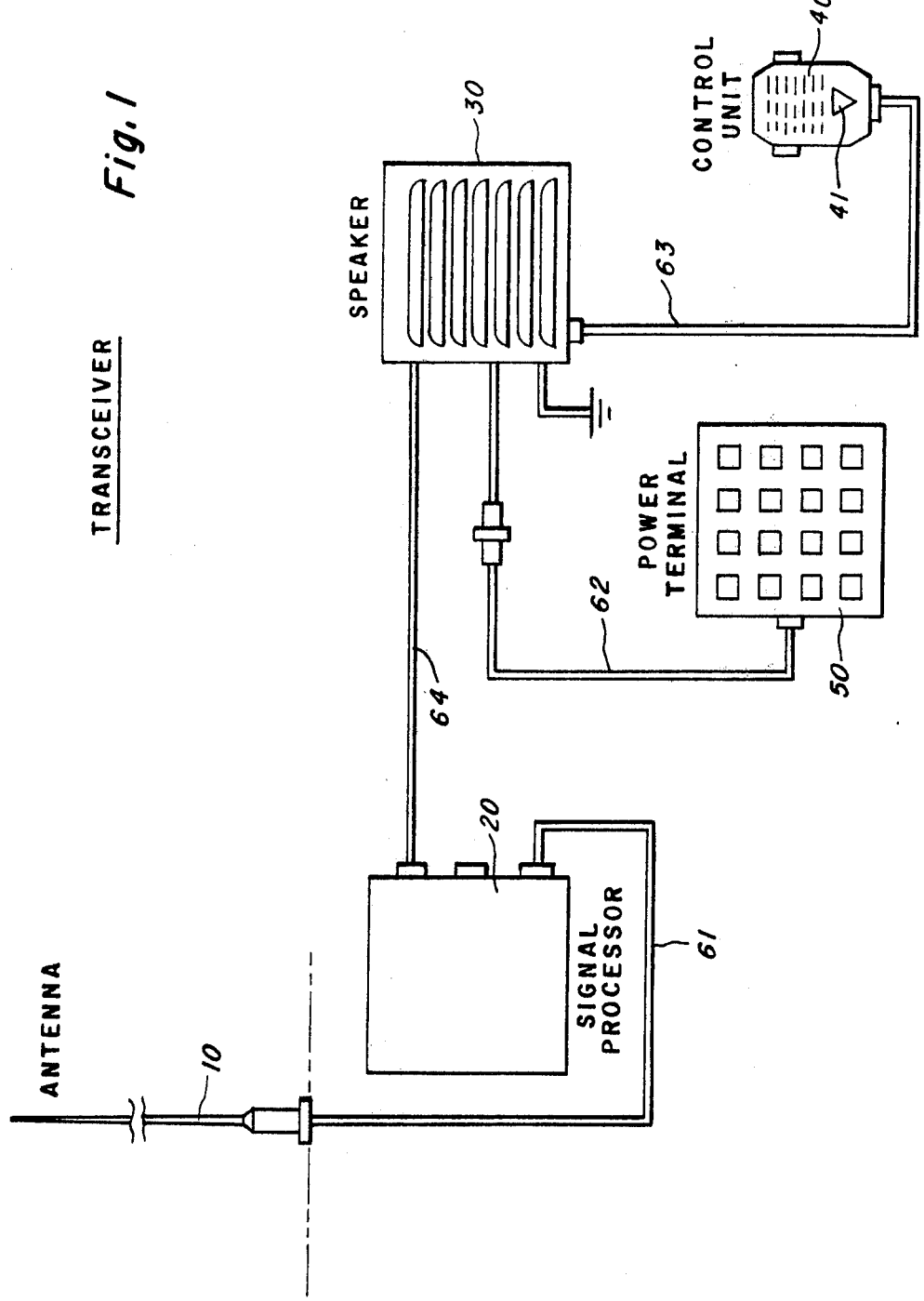
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61–64 as illustrated in FIG. 1.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
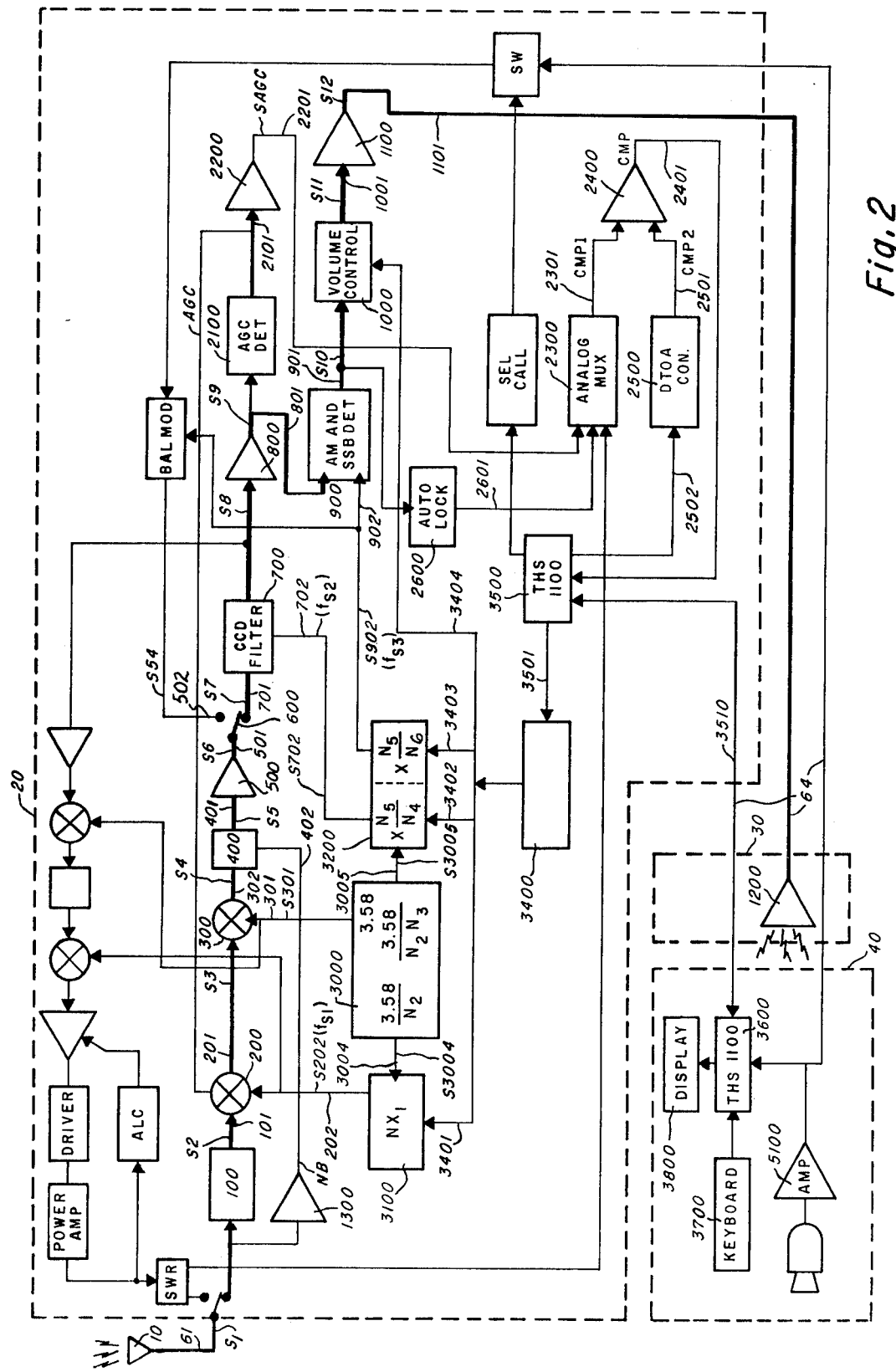
FIG. 2 is a more detailed block diagram of the transceiver of FIG. 1 wherein the receive signal path components are emphasized.
Figure 3:
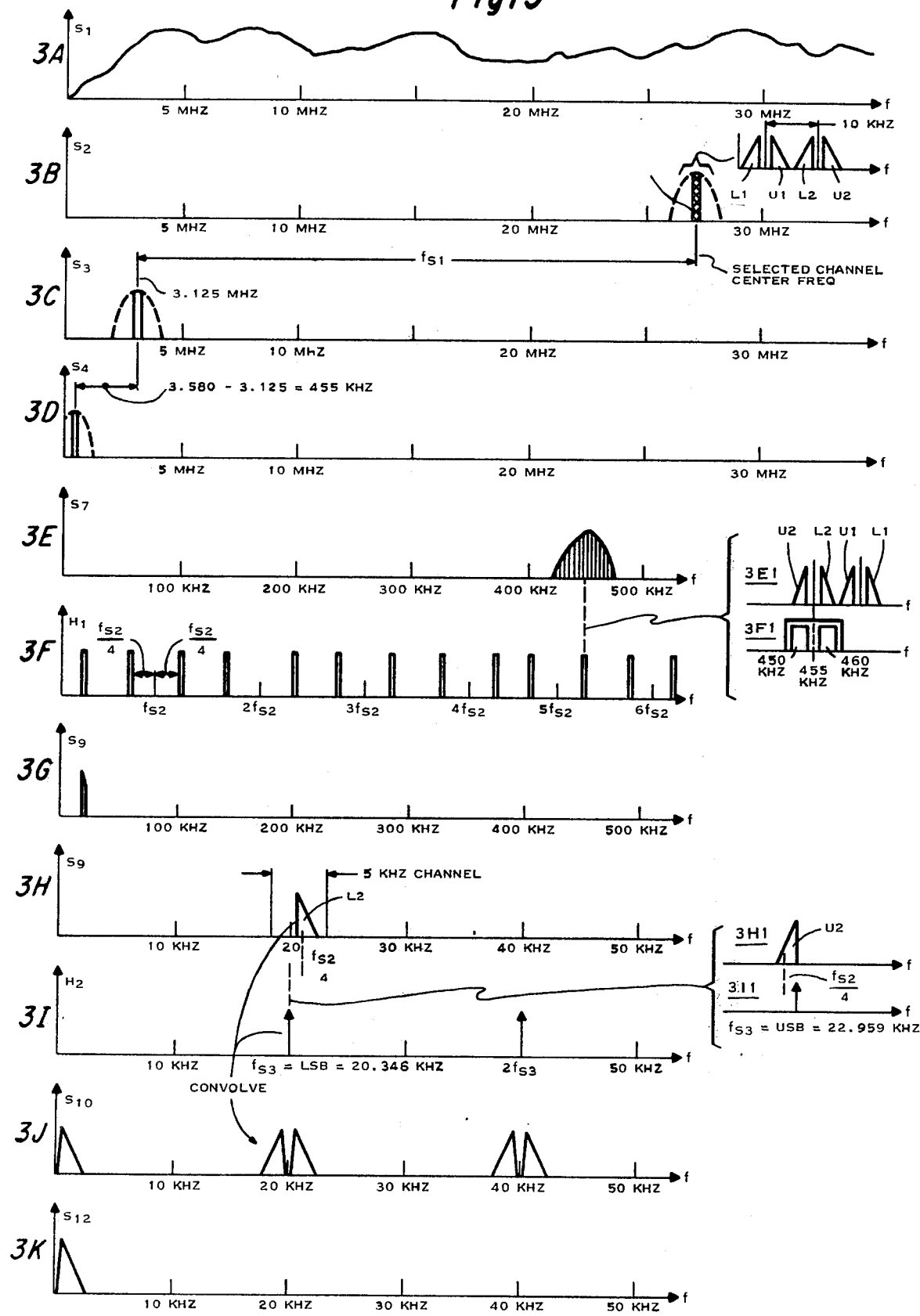
FIGS. 3A–3K are a set of frequency diagrams illustrating signals in the frequency domain which are present at various points on the receive signal path of FIG. 2.

The manner in which the transceiver of FIG. 1 performs the above described receive operation is best understood by referring to FIG. 2 and FIG. 3. FIG. 2 is a circuit diagram of the transceiver of FIG. 1. The circuit includes a signal path which is operable in the receive mode and which is emphasized in FIG. 2 by a thickened line. Signals S1–S12 are present at various points (as illustrated in FIG. 2) on this signal path. FIG. 3 is a set of frequency diagrams illustrating some of the signals S1–S12 in the frequency domain.

Antenna 10 is the first element of the receive signal path. Cable 61 couples to the output of antenna 10 and signal S1 as illustrated in FIG. 3a is generated thereon. Basically, signal S1 is unfiltered and thus is comprised of frequency components which cover the electromagnetic spectrum. Lead 61 couples to filter 100. Filter 100 has an output lead 101 and signals S2 are generated thereon. As illustrated in FIG. 3b, signal S2 has a frequency range of approximately 26MHz to 28MHz. The skirt response of filter 100 is not critical as its only function is to pass the band of frequencies lying between 26.965MHz and 27.405MHz. This range of frequencies includes 40 amplitude modulated (AM) channels as presently assigned by the FCC. Table I lists the center frequency of each of the 40 channels. Each AM channel is divided into a lower sideband channel and an upper sideband channel. FIG. 3b illustrates the 26.965Mhz—27.405MHz frequency range by the cross hatched areas S2a. FIG. 3B1 is a blow up of area S2a and single sideband channels L1, U1, L2, U2, lying within the first two AM channels are illustrated therein.

TABLE I

| CH | CENTER FREQUENCY | CH | CENTER FREQUENCY |
|---|---|---|---|
| 1 | 26.965 | 20 | 27.205 |
| 2 | 26.975 | 21 | 27.215 |
| 3 | 26.985 | 22 | 27.225 |
| x | 26.995 | 24 | 27.235 |
| 4 | 27.005 | 25 | 27.245 |
| 5 | 27.015 | 23 | 27.255 |
| 6 | 27.025 | 26 | 27.265 |
| 7 | 27.035 | 27 | 27.275 |
| x | 27.045 | 28 | 27.285 |
| 8 | 27.055 | 29 | 27.095 |
| 9 | 27.065 | 30 | 27.305 |
| 10 | 27.075 | 31 | 27.315 |
| 11 | 27.085 | 32 | 27.325 |
| x | 27.095 | 33 | 27.335 |
| 12 | 27.105 | 34 | 27.345 |
| 13 | 27.115 | 35 | 27.355 |
| 14 | 27.125 | 36 | 27.365 |
| 15 | 27.135 | 37 | 27.375 |
| x | 27.145 | 38 | 27.385 |
| 16 | 27.155 | 39 | 27.395 |
| 17 | 27.165 | 40 | 27.405 |
| 18 | 27.175 | | |
| 19 | 27.185 | | |
| x | 27.195 | | |

TABLE II

| CH | $f_{sl}$ | CH | $f_{sl}$ |
|---|---|---|---|
| 1 | 23.840 | 20 | 24.080 |
| 2 | 23.850 | 21 | 24.090 |
| 3 | 23.860 | 22 | 24.100 |
| x | 23.870 | 24 | 24.110 |
| 4 | 23.880 | 25 | 24.120 |
| 5 | 23.890 | 23 | 24.130 |
| 6 | 23.900 | 26 | 24.140 |
| 7 | 23.910 | 27 | 24.150 |
| x | 23.920 | 28 | 24.160 |
| 8 | 23.930 | 29 | 24.170 |

TABLE II-continued

| CH | $f_{sl}$ | CH | $f_{sl}$ |
|---|---|---|---|
| 9 | 23.940 | 30 | 23.180 |
| 10 | 23.950 | 31 | 24.190 |
| 11 | 23.960 | 32 | 24.200 |
| x | 23.970 | 33 | 24.210 |
| 12 | 23.980 | 34 | 24.220 |
| 13 | 23.990 | 35 | 24.230 |
| 14 | 24.000 | 36 | 24.240 |
| 15 | 24.010 | 37 | 24.250 |
| x | 24.020 | 38 | 24.260 |
| 16 | 24.030 | 39 | 24.270 |
| 17 | 24.040 | 40 | 24.280 |
| 18 | 24.050 | | |
| 10 | 24.060 | | |
| x | 24.070 | | |

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 MHz. Mixer 200 generates signals S3 by mixing signal S2 with frequency $f_{s1}$, and thus the selected AM channel is centered at the frequency 3.125 MHz. This fact is illustrated in FIG. 3c. TABLE II lists the value of frequency $f_{s1}$ along side of the number of the selected AM channel.

Lead 201 couples to a second mixer 300. Mixer 300 has a clock input lead 301 and an output lead 302. A clocking signal of 3.58 MHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. FIG. 3d illustrates signal S4.

Signal S4 passes through a noise blanker 400, and noise blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in FIG. 3e.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. Copending application, Ser. No. 758,366, entitled, "Frequency Converting Filter," by Jerry Norris and Clinton Hartmann, filed Jan. 1977, assigned to the same assignee of this application, contains a detailed description of its construction. Basically, the charge coupled device transversal filter is comprised of a plurality of serially connected stages having a split electrode structure defining an impulse response of the form (sine N/N) (cosine $2\pi f_0 N$). In this expression, the frequency $f_0$ equals $1/(N_0 \times t_s)$ where the quantity $1/t_s$ equals the selectable frequency $f_{S2}$, and $N_0$ is the number of stages over which the term cosine ($2\pi f_0 t$) completes one cycle. The bandwidth $\Delta f$ of each of the passbands equals $1/(t_s N_1)$ where the quantity $1/t_s$ again equals the selectable sampling frequency $f_{s2}$, and $N_1$ equals the number of stages in which the term (sine N)/N passes before reaching its first zero crossing. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency.

In one preferred embodiment, the parameters $N_0$ and $N_1$ are chosen such that the passbands of filter 700 have a center frequency of $N \times f_{s2} \pm \frac{1}{4}f_{s2}$, and the bandwidth of filter 700 equals $1/20 f_{s2}$. FIG. 3f illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity $1/20 f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{s2} + \frac{1}{4}f_{s2}$ is aligned with the sideband channel selected from signal S7. This is filter 700's eleventh passband. As illustrated in TABLE IIIa, a frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. FIG. 3E1 is a blow up of signal S7 about the frequency of 455 kHz, and FIG. 3F1 is a blow up of FIG. 3F about the same frequency. Together, these figures illustrate the alignment of the eleventh passband of filters 700 with the selected channel. It should also be noted, as illustrated in FIG. 3E1, that the mixing operation of mixer 300 results in the flip-flopping in frequency of the upper and lower sideband channels. This flip-flopping occurs because the mixing frequency of 3.58 mHz is higher than the center frequency of the selected AM channel, i.e., 3.125 mHz.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz. TABLE IIIb illustrates that a clocking frequency $f_{s2}$ equal to 202,218 Hz causes filter 700 to have its passband centered at 455 kHz and a bandwidth of approximately 10 kHz. This situation is also illustrated in FIGS. 3E1 and 3F1.

TABLE IIIa

| $\frac{1}{20} f_{s2}$ | $5f_{s2} + \frac{1}{4} f_{s2}$ | $f_{s2}$ |
|---|---|---|
| 5 kHz | 450 kHz | 86,409 Hz |
| 5 kHz | 460 kHz | 86,932 Hz |

TABLE IIIb

| $\frac{1}{20} f_{s2}$ | $2f_{s2} + \frac{1}{4} f_{s2}$ | $f_{s2}$ |
|---|---|---|
| 10 kHz | 455 kHz | 202,218 Hz |

Lead 703 couples the output of CCD filter 700 to an amplifier 800. Amplifier 800 is tuned to pass only those frequencies lying within the first passband of CCD filter 700. That is, amplifier 800 only passes frequencies lying about $\frac{1}{4} f_{s2}$. Amplifier 800 has an output lead 801 and signals S9 are generated thereon. FIG. 3G illustrates signal S9 on the same frequency scale as FIG. 3F (which illustrates the passbands of filter 700); and FIG. 3H illustrates signal S9 on an expanded frequency scale so that its characteristics are more apparent. In FIG. 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. FIG. 3I illustrates the frequency components of a sampling transfer function H2 which samples at a frequency $f_{s3}$ and FIG. 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in FIG. 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5 KHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200–3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 is coupled to a speaker 30 where the signals S12 shown in FIG. 3K are converted to audible sound.

Mixer 200 is illustrated in detail in FIG. 4A. Basically, mixer 200 is comprised of a dual gate MOSFET 210. One of the dual gates couples to signal S2 via lead 101, and the other gate couples to signal S202 via lead 202. The conductance of FET 210 is proportional to the product of the signals on its two gates. Signal S3 on lead 201 is generated at the source of FET 210, and thus it equals the product of signals S2 and S202. A tank circuit 211 having a resonant frequency of 3.125 mHz couples to lead 201. A logic signal FEO couples to the drain of FET 210 through a 10-K resistor 212. When signal FEO is at a high voltage, the gain of mixer 200 increases; whereas, when signal FEO is low, the gain of mixer 200 decreases. Signal FEO is thus utilized to logically step the gain of mixer 200 by approximately 40 dB.

FIG. 4B is a detailed circuit diagram of mixer 300. Mixer 300 is also comprised of a dual gate MOSFET 310. One of the dual gates couples to signal S3 via lead 201, and the other gate couples to signal S301 via lead 301. A bias circuit 312 couples lead 201 to minus 8 volts. A tank circuit 311, having a resonant frequency of 455 kHz, serially couples ten-volts to the source of FET 310 where signal S4 on lead 302 is generated. As previously described, switch 600 has signal inputs coupled to leads 501 and 502, and an output coupled to lead 701. A logic signal determines whether lead 501 or 502 is coupled to lead 701 dependent upon whether the transceiver is in a receive mode or a transmit mode, respectively.

Figure 4C:
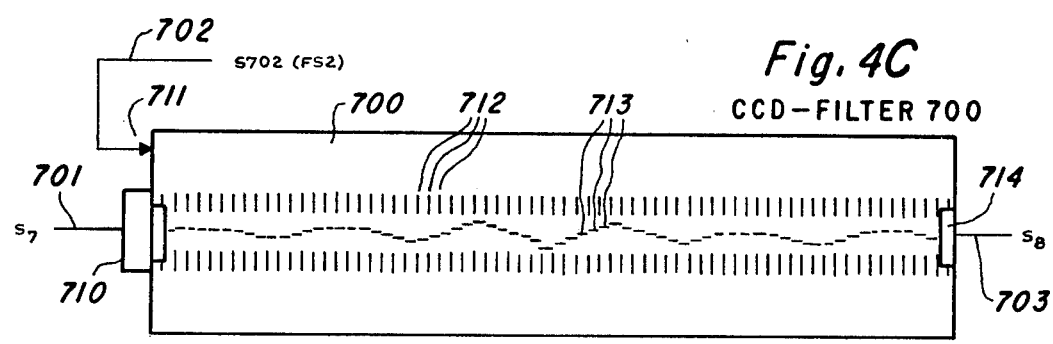

FIG. 4C is a greatly enlarged top view of CCD transversal filter 700. Lead 701 couples to an input stage 710 of filter 700. Lead 702, carrying clocking signals of the second selectable frequency $f_{s2}$, couples to the clocking input 711 of filter 700. As previously described, filter 700 is comprised of a plurality of serially-connected stages 712; and each of the stages has a split electrode. These splits 713 have a profile of the form (sine N/N) (cosine $2\pi f_0 N$). This structure has a plurality of passbands centered about multiples of the frequency $f_{s2}$ as previously described. Lead 703 couples to an output stage 714 of filter 700, and the signals S8 are generated thereon.

Figure 5:
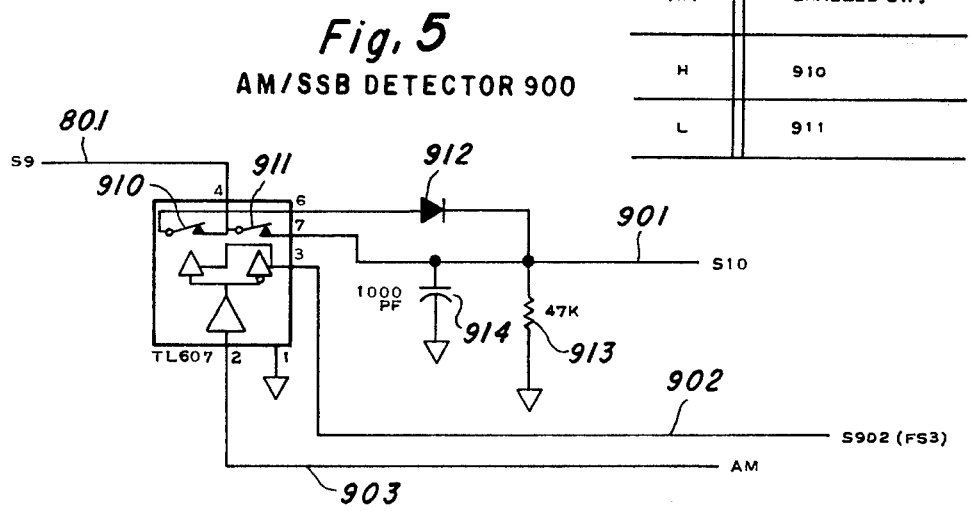
FIG. 5 is a detailed circuit diagram of AM/SSB detector 900 in the signal path of FIG. 2.

Detector 900 is illustrated in FIG. 5. Basically, detector 900 is comprised two logically-controlled switches 910 and 911 having a common input coupled to lead 801. Logic control inputs, coupled to leads 902 and 903 are provided for logically controlling the operation of switches 910 and 911. Texas Instruments part number TL607 is an example of such a switch. A logic signal AM is applied to lead 903, and signal S902 comprised of the third selectable frequency $f_{s3}$ is applied to lead 902. Switch 910 is permitted to be closed when signal AM is at a high voltage level, while switch 911 is permitted to be closed when signal AM is at a low voltage level. The actual closure of switch 910 and 911 is determined by signal S902. When amplitude-modulated signals are received, signal AM and signal S902 are both at a high voltage level, and thus, signal S9 passes through switch 910. The output of switch 910 is coupled to a diode 912 and a low-pass filter comprised of circuit elements 913 and 914. Lead 901 couples to the output of the low-pass filter. Conversely, when single sideband signals are received, signal AM is at a low voltage level and signal S902 contains the third selectable frequency $f_{s3}$. Thus, switch 911 opens and closes in response to frequency $f_{s3}$. This sampling operation shifts signal S9 down in frequency as was illustrated in FIGS. 3H–3J. The output of switch S9 couples to the low-pass filter and to lead 901.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated by modules 3000 and 3200 as multiples of 3.58 mHz. These multiples are designated as $N_1$–$N_6$ in FIG. 2. Some of the multiples are fixed, while other multiples are programmable. TABLE IV lists the selectable frequencies $f_{s1}$, $f_{s2}$, $f_{s3}$ along with the multiples $N_1$–$N_6$ and the intermediate clocking signals S3004 and S3005 as a function of the particular single sideband channel or AM channel that is to be received.

Selectable frequency $f_{s3}$ is generated by appropriately choosing $N_6$. As illustrated in TABLE IV, frequency $f_{s3}$ is suitable for demodulating lower sideband channels when $N_6$ equals 235, and is suitable for demodulating upper sideband channels when multiplier $N_6$ equals 207.

As the preceding description pointed out, sideband signals may lie anywhere within their assigned 5-kHz channel, and thus it is desirable to control the selectable frequency $f_{s2}$ in fine increments. TABLE IV implies how this fine incremental control is obtained. Signal S3005 has a fixed frequency of 250 hertz and multiplier $N_4$ is fixed at 55. This produces a frequency of 250 Hz/55 or approximately 5 Hz. Thus, by constructing multiplier $N_5$ as a programmable multiplier, frequency $f_{s2}$ is controllable in increments of approximately 5 Hz.

Figure 6A:
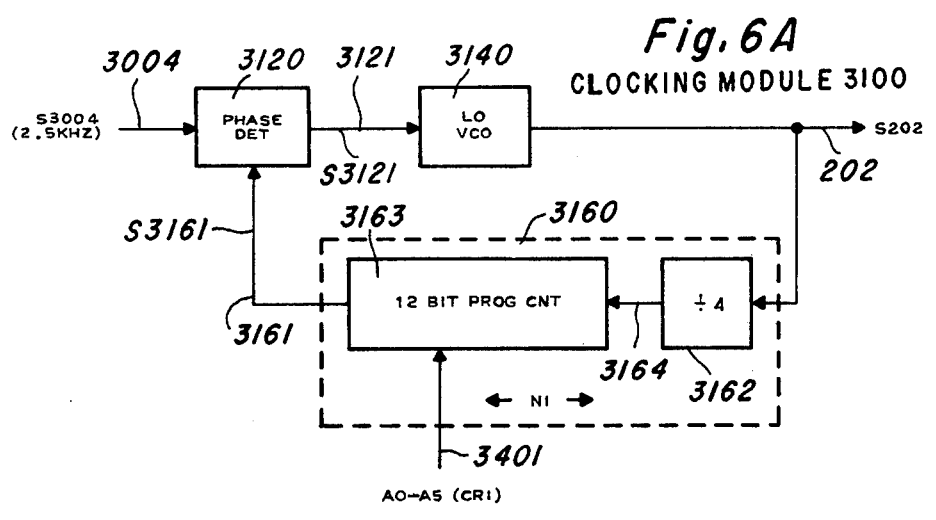

As illustrated in FIG. 6A, clocking module 3100 is implemented by means of a phase lock loop. The phase lock loop is comprised of a phase detector 3120, a voltage controlled oscillator (VCO) 3140, and a programmable counter 3160. Phase detector 3120 has a first

TABLE IV

|         | 1L        | 1U        | 2L        | 2U        | 1         | 2         |
|---------|-----------|-----------|-----------|-----------|-----------|-----------|
| osc     | 3.58MHZ   | →         |           |           |           |           |
| $f_{s1}$ | 23.84MHZ | 23.84MHZ  | 23.85MHZ  | 23.85MHZ  | 23.84MHZ  | 23.85MHZ  |
| $N_2$   | 1432      | →         |           |           |           |           |
| S3004   | 2.5KHZ    | →         |           |           |           |           |
| $N_1$   | 9,536     | → 9,540   | → 9,536   |           | 9,540     |           |
| $f_{s2}$ | 86,932HZ | 86,409HZ  | 86,932HZ  | 86,409HZ  | 202,218HZ |           |
| $N_3$   | 10        | →         |           |           |           |           |
| S3005   | 250HZ     | →         |           |           |           |           |
| $N_4$   | 55        |           |           | → 24      | →         |           |
| $N_5$   | 19,125    | 19,010    | 19,125    | 19,010    | 19,413    | 19,413    |
| $f_{s3}$ | 20,345HZ | 22,959HZ  | 20,345HZ  | 22,959HZ  | H         | H         |
| $N_6$   | 235       | 207       | 235       | 207       | X         | X         |

Some of the information in TABLE IV can be correlated with the preceding description. Compare, for example, the $f_{s1}$ frequency listings of TABLE II, with the entries in TABLE IV. Also compare the TABLE III entries of $f_{s2}$, with the TABLE IV entries of $f_{s2}$. And further compare the demodulating clocking frequency $f_{s3}$ of FIGS. 3I and 3II with the $f_{s3}$ entries in TABLE IV.

Given the values of $f_{s1}$, $f_{s2}$ and $f_{s3}$ as listed in TABLE IV, $N_1$–$N_6$ must be chosen such that the desired frequencies are obtained. To this end, multiplier $N_2$ is chosen to be 1432. Thus, signal S3004 is a fixed frequency of 2.4 kHz. Accordingly, a selectable frequency $f_{s1}$ of 23.84 kHz is obtained by setting $N_1$ to 9,536 or 9,540, respectively.

As TABLE IV further illustrates, the multiplier $N_3$ is fixed at a value of 10. Thus, signal S3005 is a fixed frequency of 250 Hz. And therefore, selectable frequency $f_{s2}$ becomes 86,932 (as required to receive lower sideband signals) when multiplier $N_5$ equals 19,125. Similarly, frequency $f_{s2}$ equals 86,409 or 202,218 when multiplier $N_5$ equals 19,010 or 19,413, respectively.

input coupled to lead 3004 and a second input coupled to an output of programmable counter 3160 via a lead 3161. A lead 3121 couples an output of phase detector 3120 to an input of VCO 3140. Lead 202 couples an output of VCO 3140 to an input of counter 3160 thereby completing the phase locked loop.

Figure 6B:
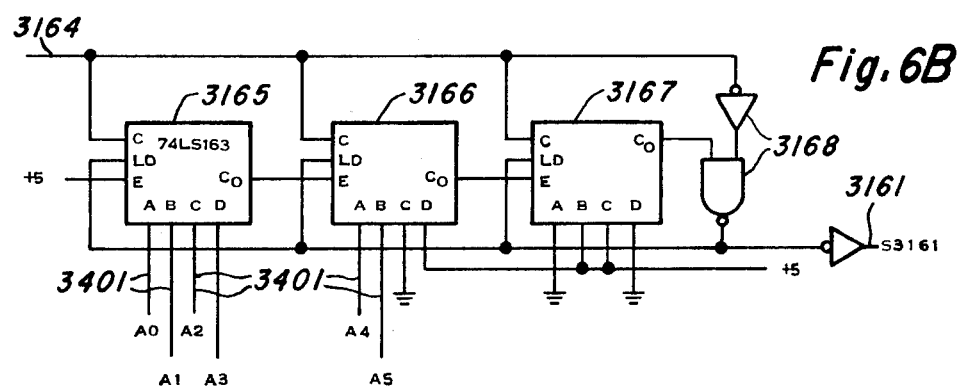

Counter 3160 is comprised of a fixed divide-by-four counter 3162, and programmable 12-bit counter 3163. Lead 202 couples to the input of divide-by-four counter, and a lead 3164 couples the divide-by-four counter output to the programmable 12-bit counter input. FIG. 6B is a detailed logic diagram of the 12-bit counter 3163. It is basically constructed of three 4-bit counters 3165-3167. Each of these counters is identical in construction to the previously-described counters 3044 and 3045. Counters 3165-3167 are serially coupled together to form one 12-bit counter. Programmable logic signals A0-A5 are supplied to the least significant six inputs of counter 3163 via lead 3401. Inputs to the most significant six bits of counter 3163 are fixed at either a 1 or a 0 logic level. Utilizing this configuration, counter 3163 has a programmable count defined in binary as 100100XXXXXX. The complement of this count is loaded into counter 3163 when its carryout is true. Logic gates 3168 are coupled to provide the necessary control signals on the LD inputs of counters 3165–3167.

A block diagram of clocking module 3200 is illustrated in FIG. 7A. As therein illustrated, the N5 factor is implemented by means of a phase lock loop. This loop is similar in structure to the phase lock loop which was utilized to implement the N1 factor as described in FIG. 6. The phase lock loop in FIG. 7 is comprised of a phase detector 3220, a VCO 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VCO 3230. A lead 3231 couples an output of VCO 3230 to an input of counter 3240, thereby completing the loop.

FIG. 7B is a logic diagram illustrating the details of the 16-bit programmable counter 3240. Basically, it is comprised of four, 4-bit up counters 3250–3253, which are identical in construction to the previously-described 4-bit up counters, 3044 and 3045. Counters 3250–3253 are serially coupled together to form one 16-bit counter. The least significant nine input bits of counter 3240 receive programmable logic signals A8–A15 via leads 3402. The most significant seven input bits of counter are coupled to a fixed 1 or 0 logic level. The carryout of counter 3253 is coupled via logic gates 3254 to provide the necessary control signals to the LD inputs of counters 3250–3253.

Lead 3231 also couples to a divide by N4 counter 3260. A detailed logic circuit diagram of counter 3260 is illustrated in FIG. 7C. Counter 3260 selectively divides by 55 or 24 dependent upon the state of logic signal A7 which it receives via one of the leads 3402. When signal A7 is a high voltage level, the ones complement of 24 is applied to the inputs of counter 3260; and when signal A7 is a low voltage level, the ones complement of 55 is applied to the inputs of the counter. Two 4-bit counters, 3265 and 3266, having a construction identical to counters 3044 and 3045 are utilized to implement counter 3260. Logic gates 3267 provide the means for generating control signals on the LD inputs 3265 and 3266.

Figure 7D:
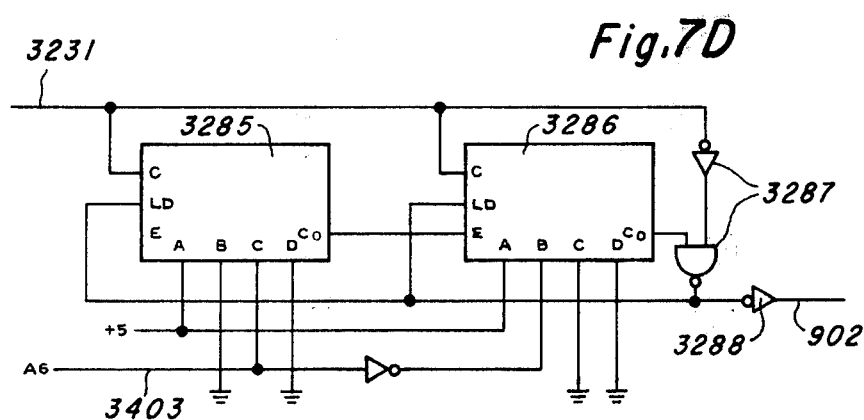

FIG. 7D illustrates the details of the divide-by-N6 counter which is utilized to generate the third selectable frequency $f_{s3}$. As therein illustrated, the divide N6 counter 3280 is similar in construction to the previously-described counters. That is, it is comprised of two, four-bit up counters 3285 and 3286 which are identical to the previously-described counters 3044 and 3045. The data inputs of these counters are selectively set to be the ones complement of 235 when the logic signal A6 is high, and the ones complement of 207 when the logic signal A6 is low. A logic gate 3288 couples to lead 902, and the logic signal S902 comprised of the third selectable frequency $f_{s3}$ is generated thereon.

Figure 8:
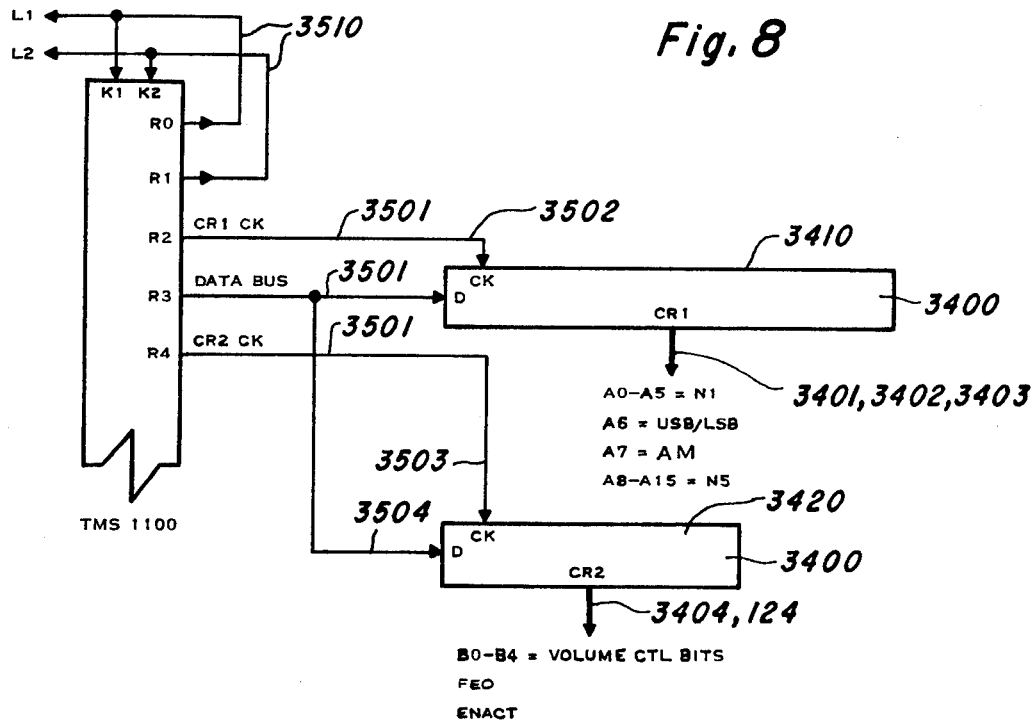
FIG. 8 is a circuit diagram illustrating the source of logic signals which are utilized by clocking modules 3000–3200.

Referring now to FIG. 8, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Output bits 0–6 of register 3410 are coupled to lead 3401 and signals A0–A6 are generated thereon. Output bits 7–15 of register 3410 are coupled to leads 3402 and signals A7–A15 are generated thereon. Output 3410 is coupled to lead 3403 to generate signal A6.

The second register 3420 is a seven-bit register. It has output bits 0–4 coupled to leads 3404 to thereby provide the volume control logic signals B0–B4. Bit 5 of register 3240 is coupled to lead 124 to provide previously described logic signal FE0. Bit 6 of register 3240 provides a logic signal ENACT (enable auto call transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al assigned to Texas Instruments Incorporated.

The TMS1100 includes an 11-bit output register having bits labeled R0–R10. As illustrated in FIG. 8, bit R2 is coupled to the clocking input of register 3410 via a lead 3502, and a clocking signal CR1CK is generated thereon. Similarly, bit R4 is coupled to the clocking input of register 3420 via a lead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1–N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000–3200 may be implemented with circuits other than those illustrated in FIGS. 5–8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to $\frac{1}{4}$. For example, k could equal $\frac{1}{8}$, in which case the values of N1–N6 would be scaled appropriately.

Figure 9:
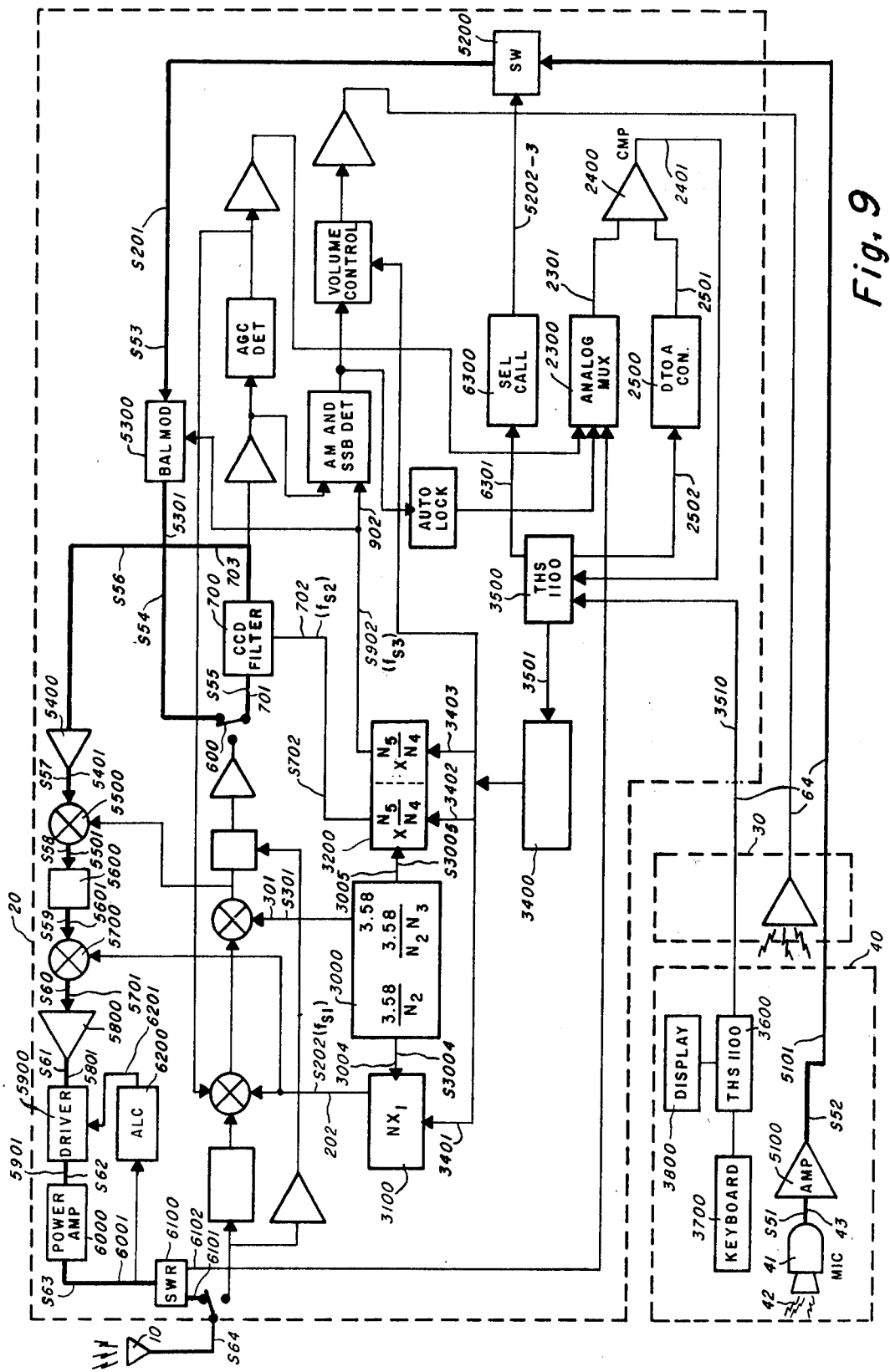
FIG. 9 is a circuit diagram identical to FIG. 2 with the exception that the transmit signal path components are emphasized rather than the receive signal path components.

The operation of the transceiver of FIG. 1, while it is in the transmit mode, will now be described in conjunction with FIGS. 9 and 10. FIG. 9 is identical to the previously described FIG. 2, except that FIG. 9 contains reference numerals identifying those components of the transceiver which are utilized in a transmit mode, whereas FIG. 2 contains reference numerals identifying those components used in the receive mode. Also, in FIG. 13, the transmit signal path is emphasized by a thickened line, whereas in FIG. 2, the receive signal path is emphasized by a thickened line. Signals S51–S64 are generated at various points on the transmit signal path as shown in FIG. 10.

Microphone 41 is the first component included within the transmit signal path. Microphone 41 receives sound waves 42, and in response thereto, generates electronic signals S51 shown in FIG. 10A on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Modulator 5300 generates signals S54 by sampling signals S53 at a frequency $f_{s3}$ of approximately 22 kHz. FIGS. 10B and 10C illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

In the transmit mode, filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen as designated in TABLE V such that the desired filtering is performed. FIG. 10D illustrates the passbands of filter 700 when it is clocked to pass only the lower sideband. As was the case for the previously-described read mode of operation, the 11th passband of filter 700 is used to filter sidebands from an input signal; whereas, the fifth passband of filter 700 is used to filter an AM band from an input signal.

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. FIGS. 10E and 10F illustrate signals S56 and S57 in the frequency domain. As therein illustrated, signal S56 includes a plurality of filtered frequency bands; whereas, signal S57 includes only that band which is nearest to 455 kHz.

TABLE V

| $f_{s2}$ | MODE |
|---|---|
| 86,409 Hz | USB |
| 86,932 Hz | LSB |
| 202,218 Hz | AM |

Lead 5401 couples to the input of a mixer 5500. Mixer 5500 has a clocking input which is coupled to a lead 301 for receiving signals S301 thereon. Signal S301 includes a fixed 3.58-mHz frequency, and it is generated as described supra. Mixer 5500 has an output coupled to a lead 5501, and signals S58 are generated thereon. Signals S58 equal signals S57 frequency shifted to 3.58 mHz ±455 kHz.

Lead 5501 couples to the input of the filter 5600. Filter 5600 is tuned to only pass frequencies near 3.125 mHz. The output of filter 5600 is coupled to a lead 5601, and signals S59 are generated thereon. FIG. 10I illustrates signals S59 in the frequency domain.

Lead 5601 couples to the input of a mixer 5700. Mixer 5700 has a clocking input which couples to lead 202 for receiving signals S202. Signals S202 are generated as previously described, and contain the first selectable frequency $f_{s1}$. Frequency $f_{s1}$ is selectively chosen such that the sum of $f_{s1}$ +3.125 mHz equals the center frequency of the channel on which signals S51 are to be broadcast. Mixer 5700 has an output coupled to a lead 5701, and signals S60 are generated thereon. Signals S60 equal signals S59 frequency shifted to $f_{s1}$ +3.125 mHz as indicated in FIG. 14J.

An amplifier 5800 is coupled to receive signal S60, and to tune out the lower band of frequencies. FIG. 10K illustrates the frequency spectrum of signal S61.

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in FIG. 10K.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A digital processor controlled signal processor comprising:
   (a) a charge transfer device transversal filter means having a selectively controllable passbandwidth centered about a finely tuneable center frequency, said filter means being coupled to simultaneously receive: (1) filter input signals comprised of a plurality of frequency bands which lie within a selected one of a plurality of non-overlapping frequency channels, and (2) a filter clocking signal of a selectable frequency $f_{s1}$, said filter means being responsive to said filter clocking signal for controlling the passbandwidth and center frequency of said filter means in response to the frequency of said clocking signal;
   (b) a first phase lock loop clocking means having (1) an input for receiving a reference frequency $f_r$ and (2) a feedback loop comprised of a first programmable counter means responsive to digital coded programming signals for generating in response thereto a variable count $N_1$;

(c) a second programmable counter means of variable count $N_2$ responsive to said digital coded programming signals coupled to said clocking means for generating said filter clocking signals at said selectable frequency $f_{s1}$ where $f_{s1} = f_r(N_1/N_2)$; and (d) digital processor means responsive to logical control signals for computing the passbandwidth and center frequency of said filter means and for generating said digital coded programming signals in accordance therewith.

2. The signal processor according to claim 1 including:

(a) signal mixer means having inputs coupled to simultaneously receive: (1) input signals comprised of a plurality of non-overlapping frequency channels with each channel containing a plurality of frequency bands, and (2) a mixer clocking signal of a selectable frequency $f_{s2}$ for frequency shifting the center frequency of a selected one of said frequency channels to a predetermined frequency;

(b) a second phase lock loop clocking means having (1) an input for receiving a reference frequency $f_{r2}$ and a feedback loop comprised of a third programmable counter means responsive to second digital coded programming signals for generating a variable count $N_3$;

(c) a fourth counter means of variable count $N_4$ responsive to said second digital coded programming signals coupled to said second clocking means for generating said mixer clocking signals at said selectable frequency $f_{s2}$ where $f_{s2} = f_{r2}(N_3/N_4)$, said digital processor means being responsive to said logical control signals for computing the difference between the center frequency of said selected one of said frequency channels and said predetermined frequency for generating said second digital coded programming signals in accordance with said difference; and (d) means coupling said mixer means to said filter means.

3. The signal processor according to claim 2 further including sampling demodulator means having a signal input coupled to said filter means for receiving therefrom filtered signals of a selected bandwidth and selected center frequency, and a sampling input coupled to receive a sampling clock signal $f_{s3}$; and a fifth programmable counter means of variable count $N_5$ coupling said first phase lock loop clocking means to said sampling input, said fifth counter means being responsive to third digital coded programming signals for generating said sampling clock signal $f_{s3}$ wherein $f_{s3} = f_r(N_1/N_5)$.

4. The signal processor according to claim 3 further including modulator means having inputs coupled to simultaneously receive said sampling clock signals $f_{s3}$ and information signals for modulating said information signals by $f_r(N_1/N_5)$ and including second signal mixer means having inputs coupled to simultaneously receive said mixer clocking signals $f_{s2}$ and said modulated information signals for mixing said information signals by $f_r(N_3/N_4)$.

* * * * *